(12) United States Patent
Filo et al.

(10) Patent No.: US 6,801,815 B1
(45) Date of Patent: Oct. 5, 2004

(54) SOUND AND IMAGE PRODUCING SYSTEM

(75) Inventors: Andrew S. Filo, Cupertino, CA (US);
David G. Capper, Novato, CA (US)

(73) Assignee: Hasbro, Inc., Pawtucket, RI (US)

( * ) Notice: Subject to any disclaimer, the term of this patent is extended or adjusted under 35 U.S.C. 154(b) by 870 days.

(21) Appl. No.: 09/626,187

(22) Filed: Jul. 28, 2000

Related U.S. Application Data

(63) Continuation-in-part of application No. 09/513,656, filed on Feb. 25, 2000.
(60) Provisional application No. 60/184,688, filed on Feb. 24, 2000, and provisional application No. 60/154,602, filed on Sep. 17, 1999.

(51) Int. Cl.[7] .............................................. G06E 17/00
(52) U.S. Cl. .......................... 700/94; 381/334; 370/272
(58) Field of Search ............................. 700/94; 381/89, 381/332, 333, 334, 124; 365/11; 704/270, 272

(56) References Cited

U.S. PATENT DOCUMENTS

| | | |
|---|---|---|
| 4,287,568 A | 9/1981 | Lester |
| 4,698,776 A | 10/1987 | Shibata |
| 4,884,974 A | 12/1989 | DeSmet |
| 5,045,327 A | 9/1991 | Tarlow et al. |
| 5,073,140 A | 12/1991 | Lebensfeld et al. |
| 5,092,810 A | 3/1992 | Kwan et al. |
| 5,147,237 A | 9/1992 | Kwan et al. |
| 5,325,463 A | 6/1994 | Murata et al. |
| 5,359,698 A | 10/1994 | Goldberg et al. |
| 5,365,686 A | 11/1994 | Scott |
| 5,491,774 A | 2/1996 | Norris et al. |
| 5,607,336 A | 3/1997 | Lebensfeld et al. |
| 5,710,813 A | 1/1998 | Terui et al. |
| 5,742,737 A | 4/1998 | Daberko et al. |
| 5,774,863 A | 6/1998 | Okano et al. |
| 5,787,399 A | 7/1998 | Lee et al. |
| 5,826,235 A | 10/1998 | Harman |
| 5,855,001 A | 12/1998 | Doederlein et al. |
| 5,870,710 A | 2/1999 | Ozawa et al. |
| 5,903,871 A | 5/1999 | Terui et al. |
| 5,991,727 A | 11/1999 | Ono et al. |
| 6,018,709 A * | 1/2000 | Jeffway, Jr. ................. 704/258 |

FOREIGN PATENT DOCUMENTS

| | | | | |
|---|---|---|---|---|
| EP | 0875816 A2 | * | 11/1998 | ............. G06F/1/00 |
| JP | 406089567 A | * | 3/1994 | ............. G11C/5/00 |
| JP | 406215547 A | * | 8/1994 | ............. G11B/31/00 |

* cited by examiner

*Primary Examiner*—Melur Ramakrishnaiah
(74) *Attorney, Agent, or Firm*—Michael Best & Friedrich LLP

(57) ABSTRACT

An amusement system includes a cartridge having memory for storing sound data, a processing system to process the sound data and programming executable by the processing system to produce electrical sound signals representative of sound from the sound data. The system further includes a player to receive the electrical sound signals from the cartridge and to produce sound vibrations in an acoustic transducer carried with the player. The cartridge and the player include cooperating sliding electrical connectors carried on respective printed circuit boards in the cartridge and player. Each electrical connector includes a plurality of electrical contacts arranged co-planar in a two-dimensional array, in two rows which are in-line to one another and not staggered.

57 Claims, 13 Drawing Sheets

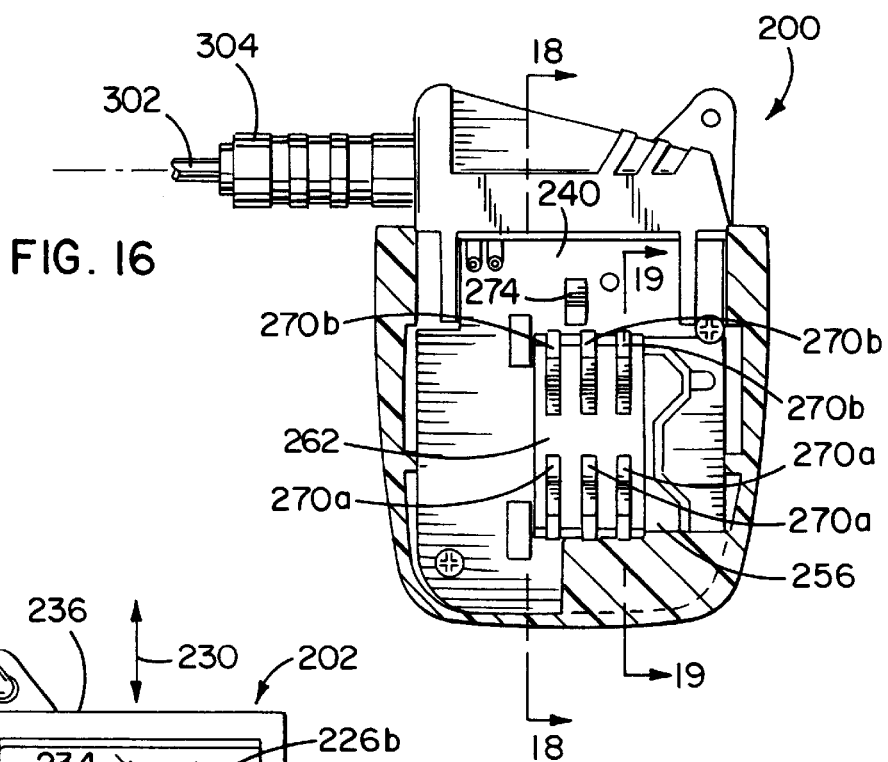
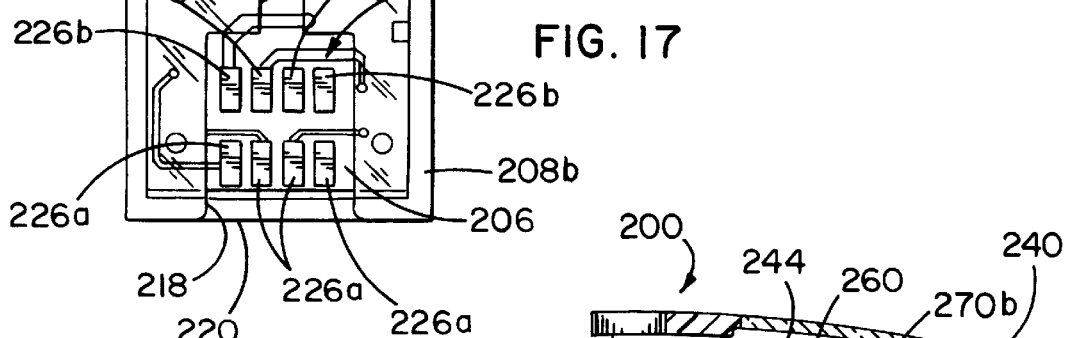
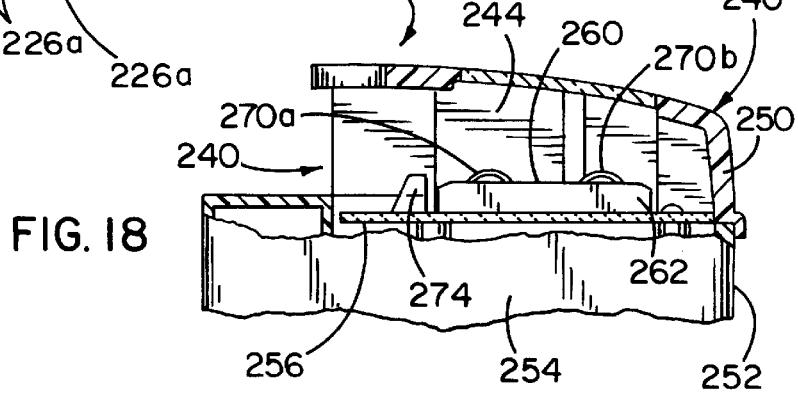
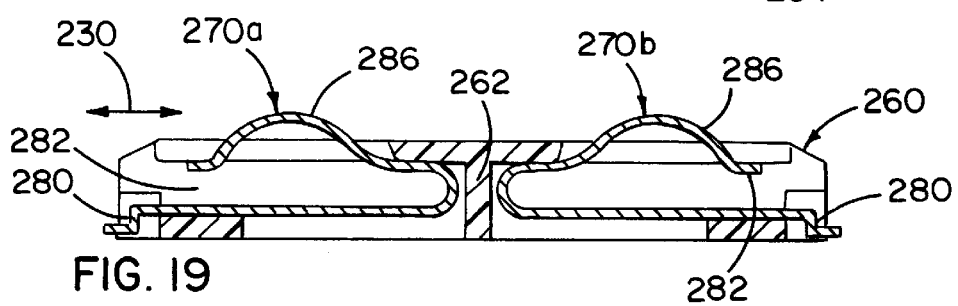

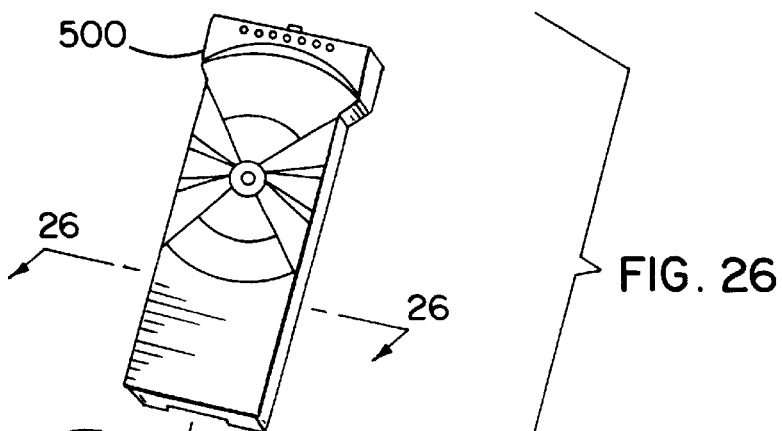
FIG. 26
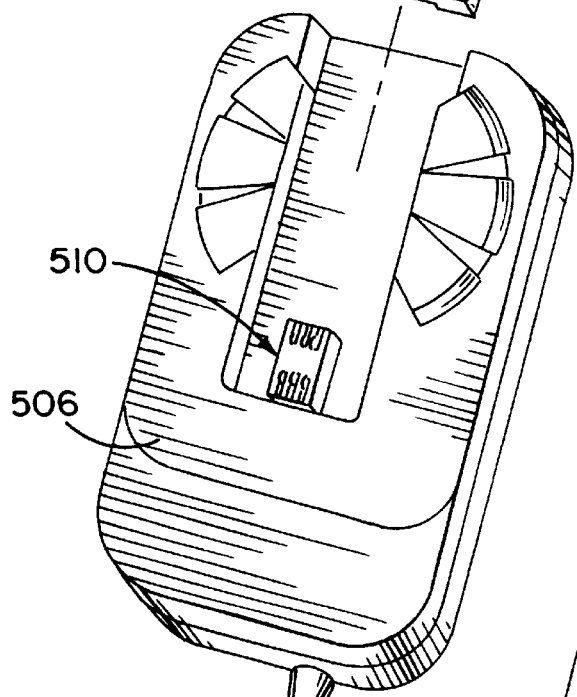
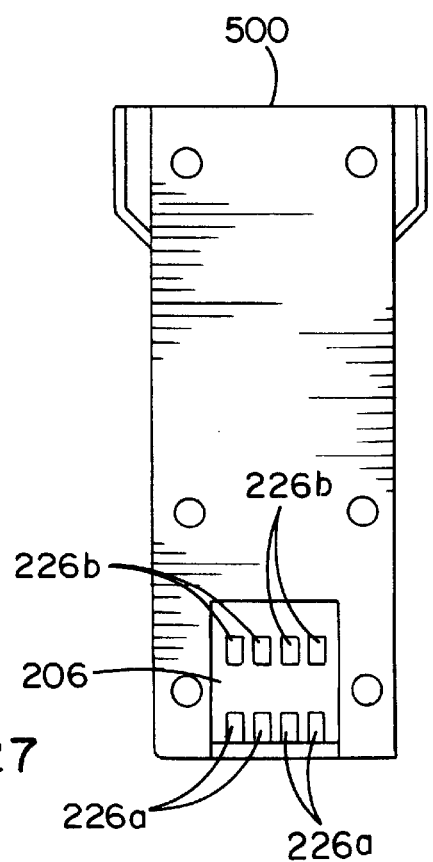
FIG. 27

SOUND AND IMAGE PRODUCING SYSTEM

CROSS REFERENCE TO RELATED APPLICATIONS

This application is a continuation-in-part of prior application Ser. No. 09/513,656 filed Feb. 25, 2000, which is based upon and claims the benefit under 35 U.S.C. § 119 of prior provisional application Nos. 60/184,688 filed Feb. 24, 2000 and 60/154,602 filed Sep. 17, 1999.

FIELD OF THE INVENTION

This invention relates to sound and image producing systems. More particularly, this invention relates to a system having cartridges that store, process, and control data representative of sounds and/or images, plus players that interface, annunciate, and transduce sounds and/or images.

BACKGROUND AND SUMMARY OF THE INVENTION

Sound and/or image producing devices such as cassette players, compact disc players, hand-held video games, etc., are popular entertainment devices. They make use of cassette tapes, compact discs or game cards that store information such as music and game commands. The cassette or compact disc player or hand-held video game receives the information stored on the tape, disc, or card, and processes that information to produce sound and/or visual images.

The invented sound and image producing system is an alternative to existing cassette players, compact disc players, and other such items in that it allows a user to conveniently produce sound, such as music and/or visual images. The system includes a cartridge that stores, processes, and controls data representative of sound and/or images, and a player that provides the interface, annunciation and transduction of sound and/or images. The cartridge includes a computer integrated circuit or chip that stores and transmits signals from which sound and/or images may be produced. For example, the cartridge includes memory, data stored in the memory, a processing system, programming executable by the processing system, and at least one connector to releasably connect the cartridge to the player. The cartridge may include a single chip or integrated circuit, with the memory, processing, and other functions all performed by the chip, such as an EMC 2200 chip or a PowerSpeech 2500 Series chip from Winbond Electronics Corporation of Taiwan. The chip may be mounted on a printed circuit board with a timing resistor, if necessary, and the connector or connectors may be associated with the printed circuit board.

The player, in contrast, is a bridge configured to receive and connect to the cartridge, to receive electrical signals from the cartridge, and to produce sound vibrations and/or visual images from the signals. The player includes a transducer to produce the sound vibrations, a battery or other power supply, and controls to trigger the cartridge to produce and transmit electrical signals representative of sound. The player may include an output, such as a liquid crystal diode, to display images. The player includes only those components necessary to produce sound vibrations and/or images from the signals received from a cartridge, a battery, and associated, associated input or output components. The player need not include any processor, memory, or other similar items because those items are resident on the cartridge. Expressed differently, the player includes only electrical components such as switches, a speaker, an LCD, and a battery, while the cartridge includes electronic components such as a computer or microprocessor, an analog-to-digital converter, and memory.

The cartridge typically has a side-to-side dimension of no more than 2 inches, and often less than 1 inch, because the cartridge is essentially a single chip. The player typically has a side-to-side dimension of no more than 3 inches, and often only slightly greater than a cartridge. This small size allows the system to b worn as a necklace or bracelet, be attached to clothing, bags or packs (such as by a clip or as a fob or zipper pull), or take the form of a toy or figurine.

One use of the sound producing system is to play popular music easily and inexpensively. Users may purchase and collect the cartridges, plug them into a player, and then listen to music. Users may also trade cartridges amongst themselves. The system is small, so it is easily carried. For example, high school students may clip players to a zipper on their backpacks.

BRIEF DESCRIPTION OF THE DRAWINGS

FIG. 16 is a cross-sectional view taken along the line 16—16 of FIG. 15;

FIG. 17 is a bottom plan view of the cartridge of FIG. 15;

FIG. 18 is a fragmentary cross-sectional view taken along the line 18—18 of FIG. 16;

FIG. 19 is a cross-sectional view taken along the line 19—19 of FIG. 16;

FIG. 26 is an exploded perspective view of a recorder and player for use in the invented sound and image producing system; and FIG. 27 is a bottom plan view of the cartridge shown in FIG. 26.

DETAILED DESCRIPTION OF THE PREFERRED EMBODIMENTS

Figure 1:
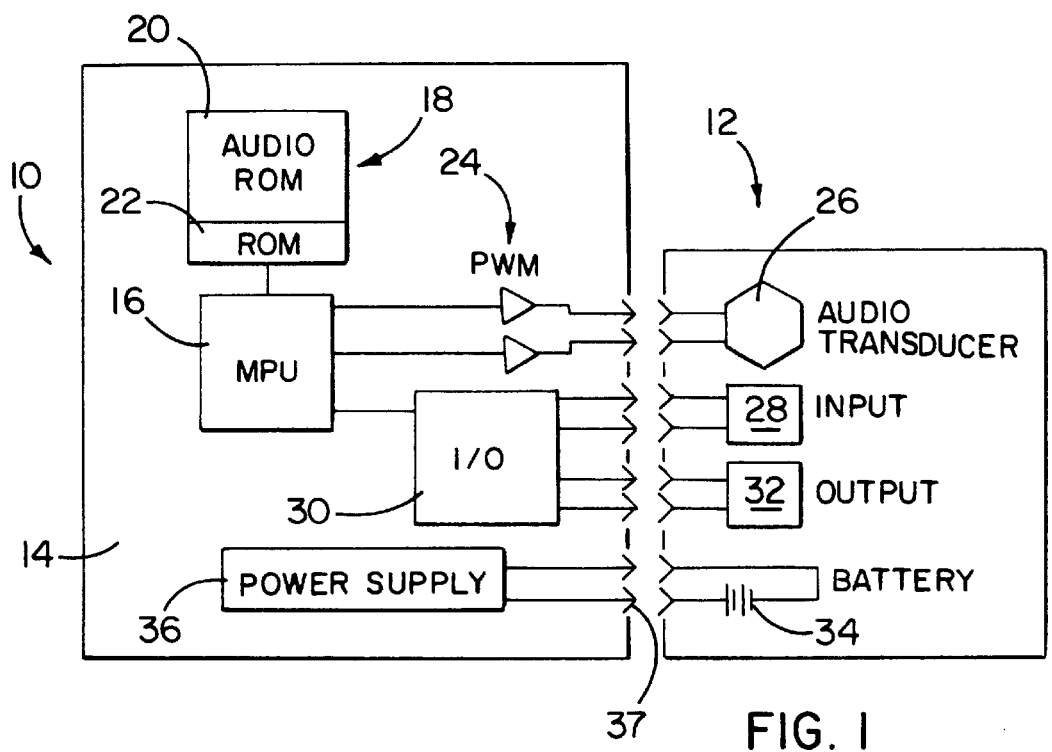
FIG. 1 is a schematic drawing of an embodiment of the invented sound and image producing system.

FIG. 1 is a schematic drawing of an embodiment of the invented sound and image producing system, including a cartridge 10 and a player 12. The cartridge includes an integrated circuit 14, having a microprocessor unit 16, and memory 18. Memory 18 includes what is referred to as audio ROM 20 to store sound data. The sound data may be stored with standard compression techniques. Memory 18 also includes ROM 22 to store other data, such as programming, decompression files, etc. The microprocessor unit 16 executes programming to produce electrical signals representative of sound from the data representative of sound, and then sends those signals to a pulse-width modulator 24, which outputs a signal to drive an audio transducer 26, such as a speaker, in player 12. Integrated circuit 14 may be mounted on a printed circuit board with a timing resistor and connectors associated with the printed circuit board.

Transducer 26, as stated, may be a speaker. Alternatively, audio transducer 26 may comprise earphones or an ear bud plugged into a jack on the player. The audio transducer also may take the form of a structure configured to contact a user's teeth, such as a "bite bar", so that sound vibrations are transmitted from the player through the teeth to the user's inner ear where they are perceived by the user as sound. This configuration provides a fun way to listen to sounds "in your head", without others hearing the sounds. The transducer may also be a combination of speakers, earphones, and bite bars.

Player 12 includes controls 28, labeled input, to trigger cartridge 10 to, perform various functions. For example, controls 28 may trigger the cartridge to play music. The controls also may be used to set volume, select different songs or tracks stored on the cartridge, turn the system on or off, or put the system in a stand-by mode. Signals from the controls 28 are input to input/output (I/O) circuitry 30 on the cartridge, to control microprocessor unit 16.

Microprocessor unit 16 also may send signals through I/O circuitry 30 to an output 32 associated with the player. Output 32 may take several forms, such as an LCD to display visual images, an LED, or a motor driving a mechanical device, such as a dancing doll. The output device may be used in playing a game with the system, displaying information about music, such as the name of an artist, the title of a song, or a track being played, displaying a video clip or image associated with the music, or displaying information about the system, such as a "battery low" indication. For example, a game and music both may be stored on the cartridge, and the game played by operating controls 28 while the system plays a user's favorite music. The action of the game may be displayed on output 32. Of course, systems may be made without output 32.

Player 12 also includes a battery 34 to supply power to the system. The battery is connected to power supply circuitry 36 on the cartridge. The power supply circuitry regulates the power from the battery for the cartridge.

One of the benefits of the system shown in FIG. 1 is that the player is simple and easy to manufacture. No processor is required in the player, and the same player may be used with different cartridges. Another benefit is that the data representative of the sound is stored and processed on a single chip, it is not "moved" between separate components where the data could be corrupted by electronic noise or minor power variances. The connections between the cartridge and player (represented by arrows such as arrow 37 in FIG. 1) are minimized, and low integrity connections are possible.

Figure 2:
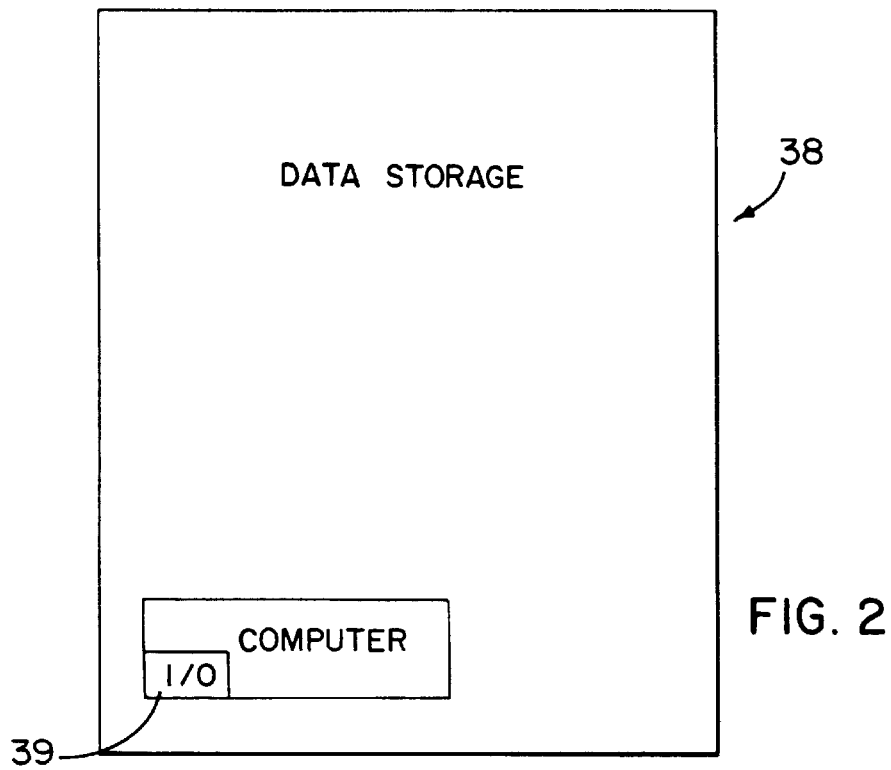
FIG. 2 is a diagram of one layout for a chip that may be used in the invention.

FIG. 2 is a diagram of one layout for a chip 38 used in a cartridge. This layout shows that most of the chip's volume is for data storage. The chip includes a computer and an I/O interface 39, but they take very little space on the chip. The chip may be thought of as "smart", because it includes processing and I/O capability, while a player associated with the chip can be "dumb", or in other words, a simple device that does not require its own processing capability and that is easily manufactured.

Figure 3:
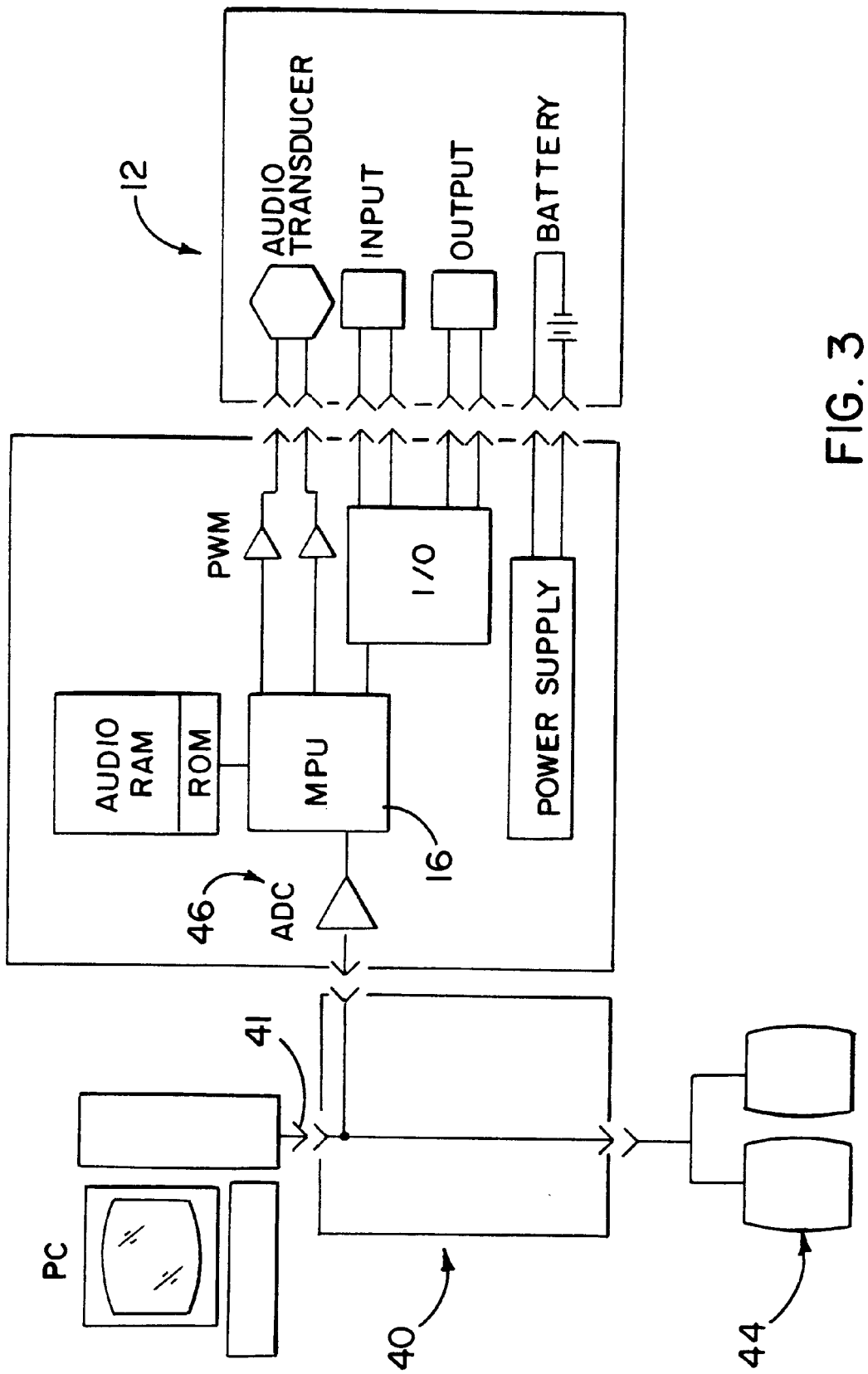
FIG. 3 is a schematic drawing of another embodiment of the invented sound and image producing system.

FIG. 3 is another embodiment of the invented sound producing system, including cartridge 10 and player 12, as discussed in connection with FIG. 1. FIG. 3, however, shows an embodiment that allows for the recording of sounds. This embodiment includes a recorder controller 40, used to record sound on cartridge 10. Recorder controller 40 is attached to a standard audio port or speaker jack 41 on a personal computer 42. The audio port typically is an amplifier output configured to output signals sufficient to drive a speaker. Recorder controller 40 receives an analog signal from the computer. That analog signal is passed through to speakers 44 associated with the computer. The signal is also directed to an analog-to-digital converted 46 on the cartridge. That converted takes the signal and changes it to a digital form, and transmits it to the microprocessor unit, where it then can be stored in memory. By taking the signal from a computer's speaker jack, and then using an analog-to-digital converter, the system avoids the need for other supporting software, and it allows the system to download and record sounds from many different computers because the signals outputted by computers to speaker jacks are in a standard, Sound Blaster, format. This embodiment allows a user to record his or her favorite music, and then play it back on the system. Sound data, including analog or digital data, may be downloaded from any source, such as the Internet or a CD-ROM. Sound data from these sources may contain music, sound, voice, or machine information. Microprocessor unit 16 or some other computer, such as a computer associated with recorder controller 40, can be used to interpret sound data that is in the form of machine information to control sounds or music, to play games, or for other such tasks.

Figure 4:
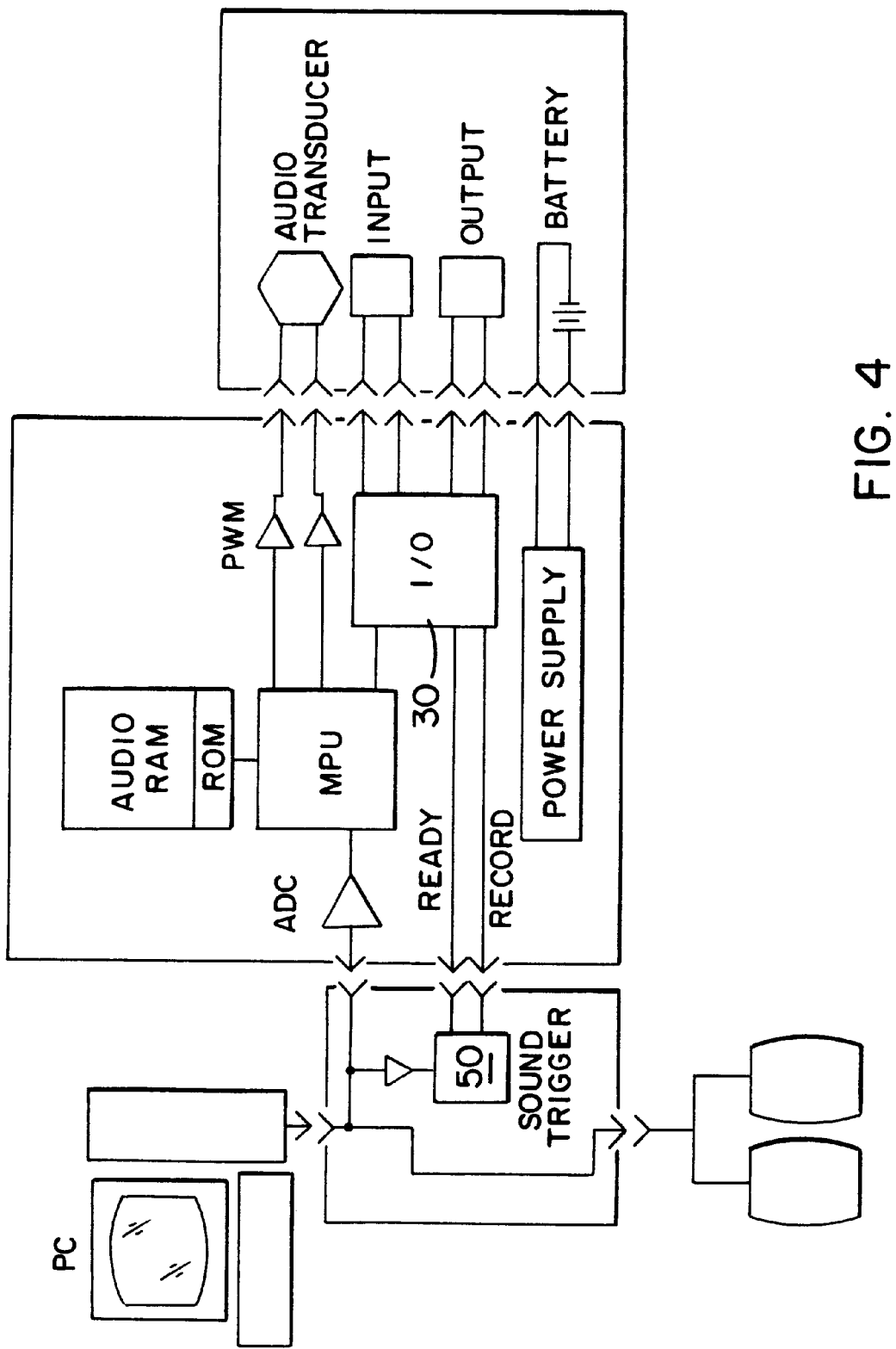
FIG. 4 is a schematic drawing of yet another embodiment of the invented sound and image producing system.

FIG. 4 is yet another embodiment of the system. This embodiment is similar to that shown in FIG. 2, except this embodiment includes a sound trigger 50 on the recorder controller to trigger the recording of sound. This sound trigger is associated with I/O 30 so that various functions can be performed. For example, the system may sequentially record different sound files instead of recording a single sound file. The sound trigger also may detect signals from the computer, and then cause the cartridge to automatically record sound. The system may record sound automatically, may record sound only when triggered by a user, or may automatically record sound detected after a user triggers the recording function.

Figure 5:
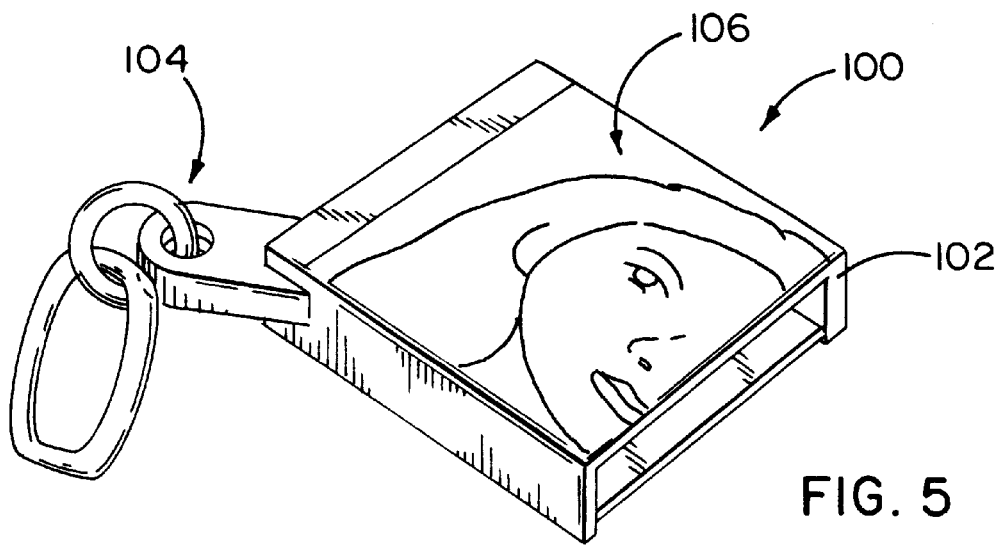
FIG. 5 shows a cartridge configured for use in the invented sound and image producing system.

FIGS. 5–10 show various cartridge and player configurations. FIG. 5 shows a cartridge 100 shaped like a small case for a compact disc. The cartridge includes a housing 102, and a loop or fob-like structure 104 on the housing to allow the cartridge to be clipped to clothing, clothing accessories, or other items. The cartridge may also include art on the housing relating to the sound stored by the cartridge. For example, artwork such as a picture 106 of a rock star is on cartridge 100, and a song by the rock star may be stored on the cartridge.

Figure 6:
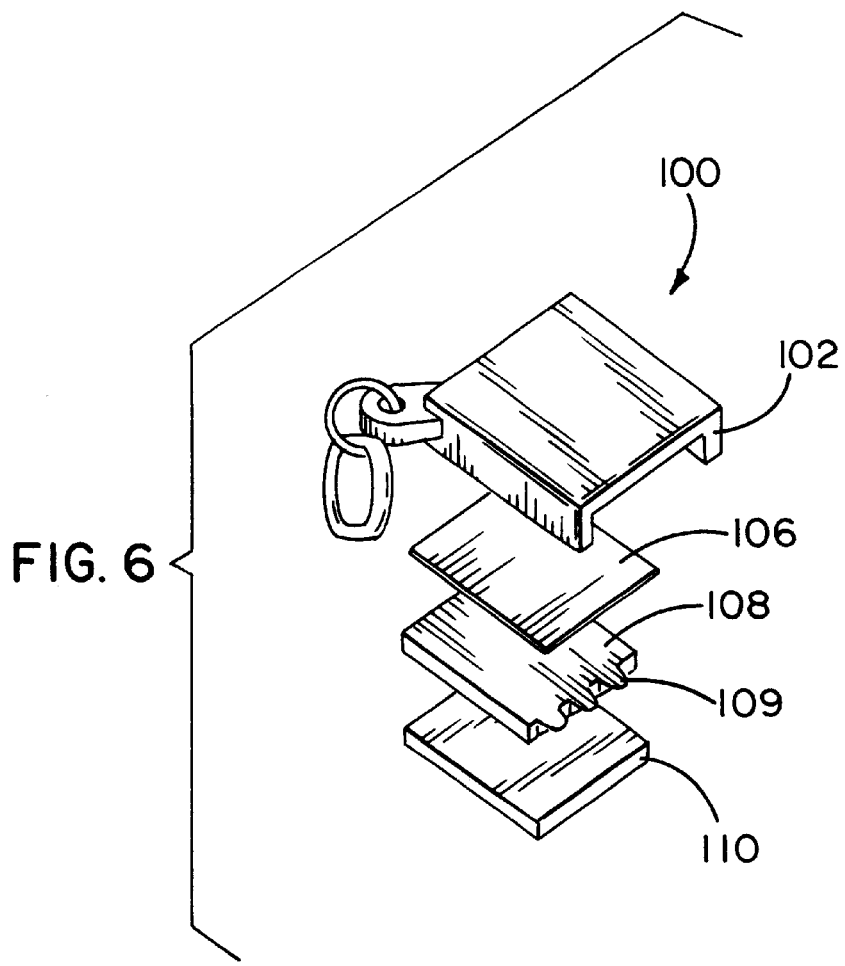
FIG. 6 shows components of a cartridge in an exploded view.

FIG. 6 shows components of cartridge 100 in an exploded view. The components include housing 102, art 106, a printed circuit board 108 with connectors 109, and a housing bottom 110. An integrated circuit, such as integrated circuit 14 discussed above, may be mounted on printed circuit board 108.

Figure 7:
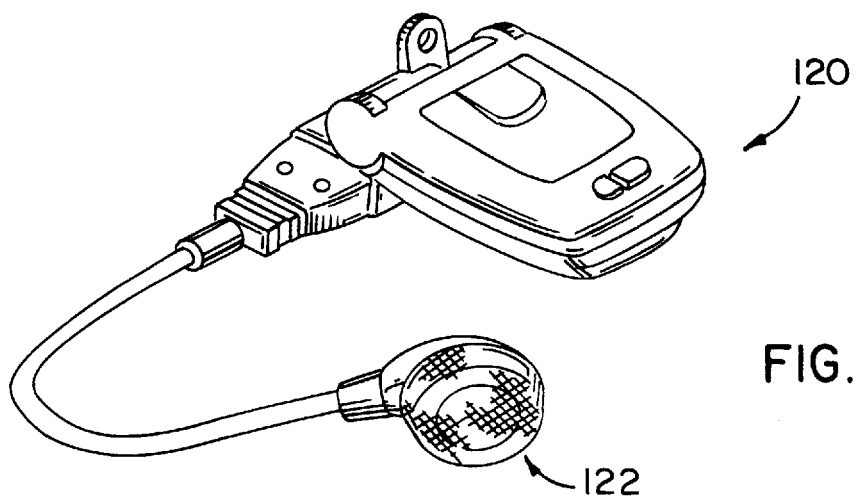
FIG. 7 shows a player for use in the invented sound and image producing system and configured to look like a small compact disc player.
Figure 8:
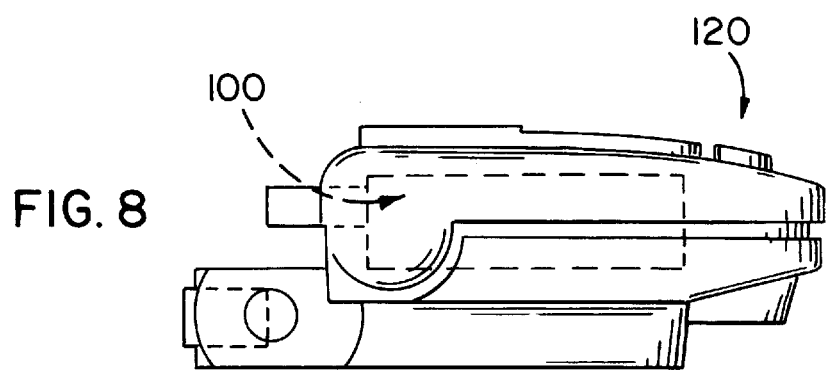
FIG. 8 shows a side view of the player of FIG. 7.
Figure 9:
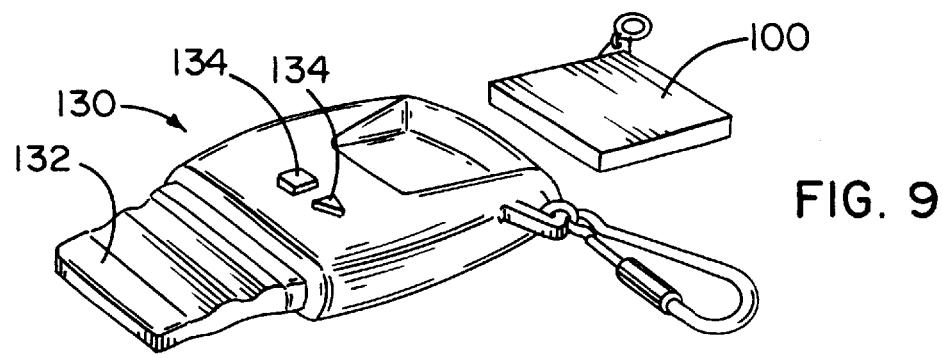
FIG. 9 shows a player configured for denta-mandibular sound transmission.
Figure 10:
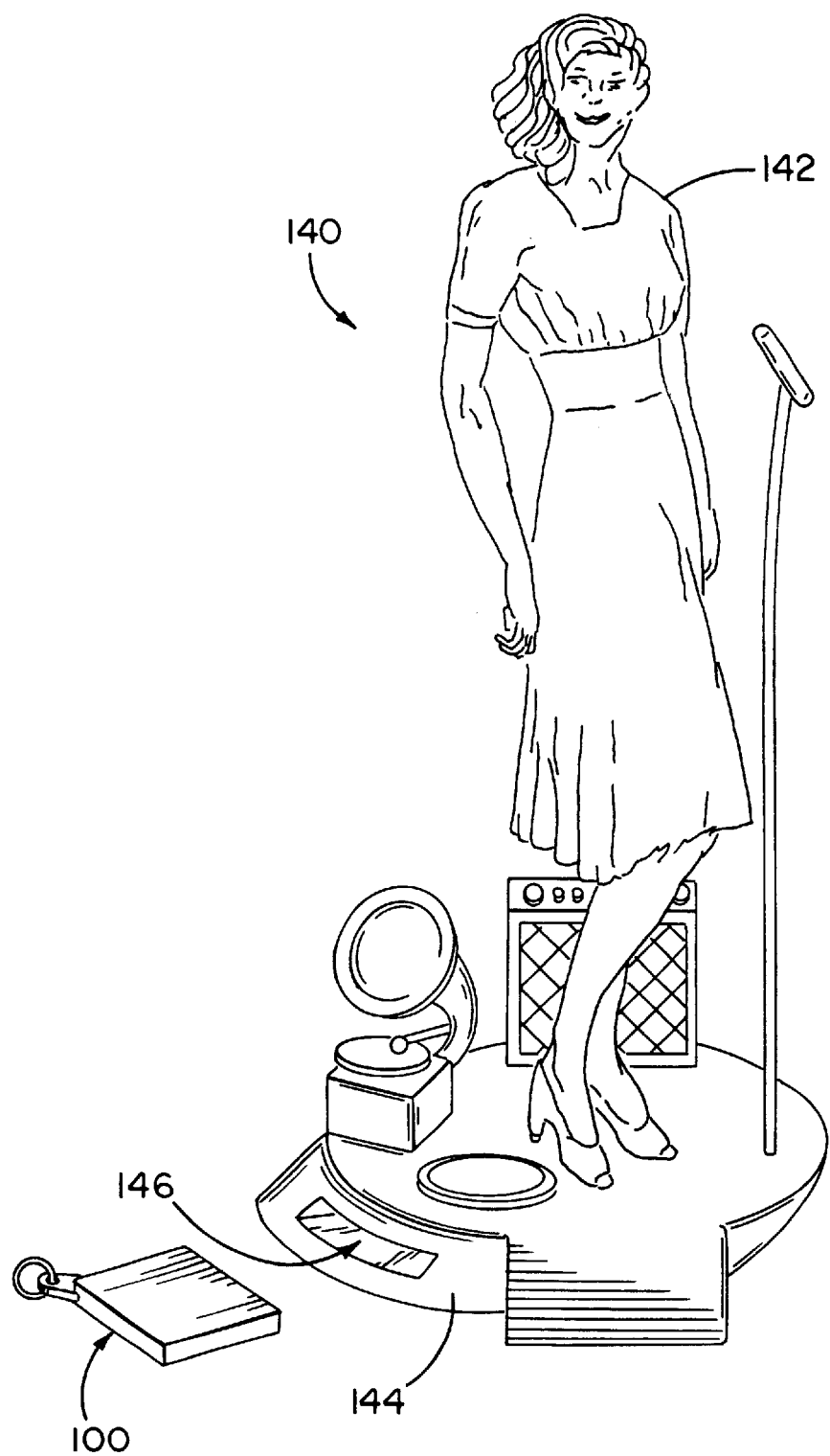
FIG. 10 shows a player configured like a toy doll or figurine.
Figure 11:
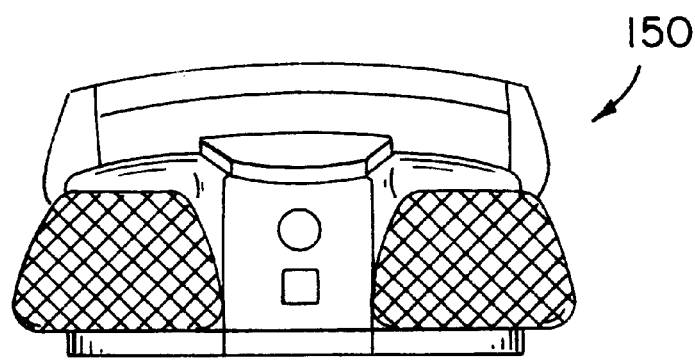
FIG. 11 shows a player configured like a small portable stereo or "boom box"
Figure 12:
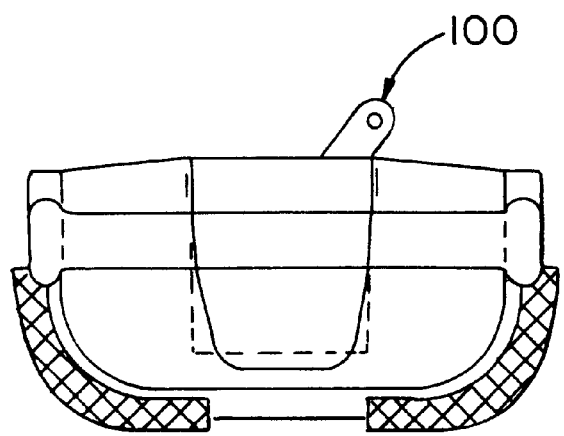
FIG. 12 shows a top view of the player of FIG. 11.
Figure 13:
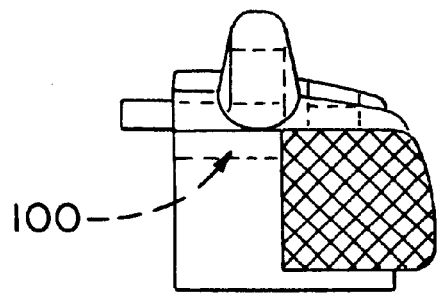
FIG. 13 shows a side view of the player of FIG. 11.

FIGS. 7–13 show various players. FIGS. 7 and 8 show a player 120 shaped like a miniature compact disc player. In FIG. 7, an ear bud or earphone 122 is shown attached to the player. FIG. 8 is a side view of the player, and it shows (in dashed lines) a cartridge 100 plugged into the player. FIG. 9 shows a player 130 configured for denta-mandibular sound transmission. That player includes a bite bar 132 configured to contact a user's teeth or mouth so that sound vibrations may travel from the bite bar through the user's teeth and jaw to the user's inner ear, where the vibrations may be perceived as sound. Player 130 also includes controls buttons 134 to control the operation of the player. Cartridge 100 is shown in FIG. 9 separate from the player, ready to be plugged into the player. The player also may take the form of a doll or figurine. For example, the player may be a figurine resembling a singer, such as a rock star, and the system could then be used to play the singer's music. FIG. 10 shows a player 140 including a doll or figurine 142 on a base 144. The base includes an opening 146 configured to receive cartridge 100, as shown. Doll 142 may be separable from the base so that it may have entrainment or play value independent and separate from the playing of sounds. In such an embodiment, the base may be thought of as a docking station. If the player is a doll resembling a music personality, and the player is configured to download and record music, then a user may record recent popular songs associated with the music personality, and then easily change the songs in the future. FIGS. 11–13 show a player 150 configured to resemble a small portable stereo, commonly called a "boom box". FIGS. 12 and 13 show cartridge 100 (drawn partially in dashed lines) plugged in or inserted into the player. Of course, the player may take various other forms as well, such as a toy car, some other toy, a watch, a necklace, a bracelet, a zipper pull, etc.

Another use of the invented sound producing system is as a music sampler.

Figure 14:
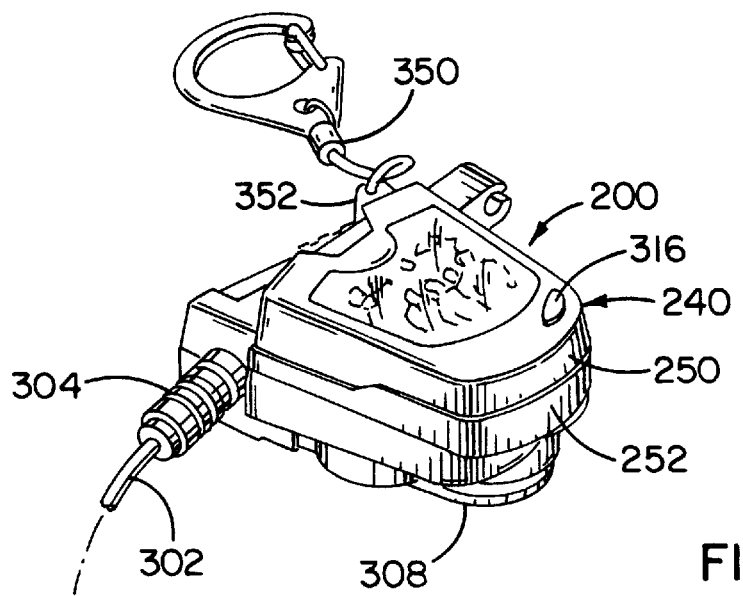
FIG. 14 is a perspective view showing an alternative embodiment of a player for use in the invented sound and image producing system.
Figure 15:
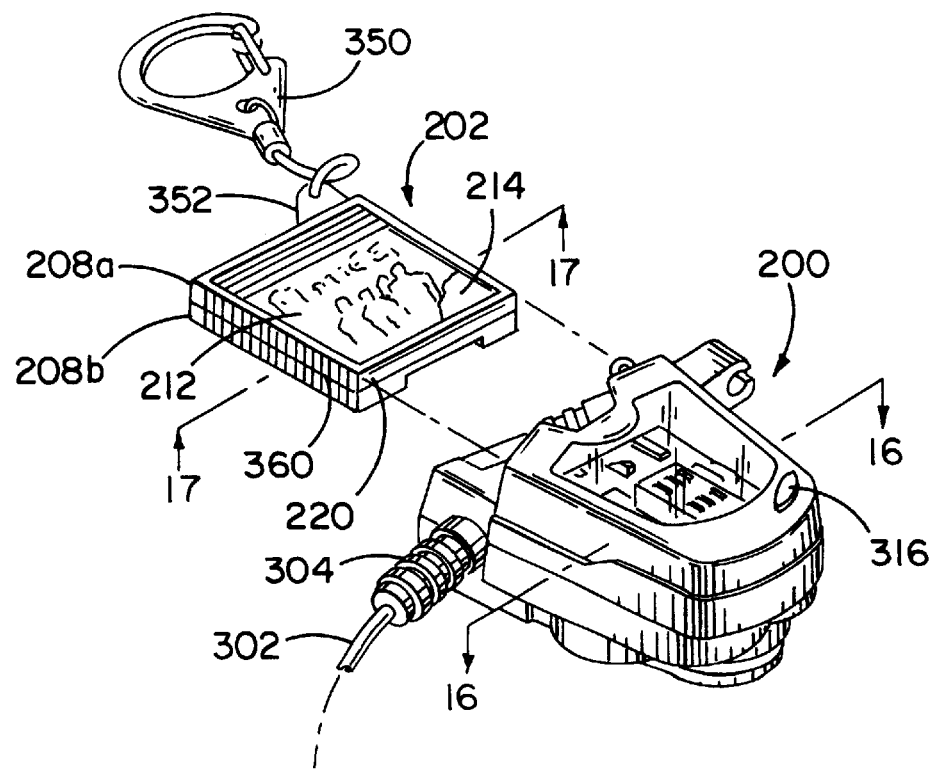
FIG. 15 shows the player of FIG. 14 in combination with a cartridge.

Referring now to FIGS. 14–25, a preferred embodiment of a player 200 and a cartridge 202 will be described. Although the player and cartridge shown in FIGS. 14–25 have found immediate commercial application for use as a music sampler amusement system, they can also be readily employed for other purposes such as a music player amusement system. FIG. 14 shows a perspective view of the player 200, while FIG. 15 shows the player in combination with a cartridge 202. In general, cartridge 202 contains a processing system for processing stored sound data whereas player 200 does not contain a processing system. Player 200 is generally similar to the player 120 shown above in FIG. 7, and cartridge 202 bears similarities to the cartridge 100 shown above in FIGS. 5 and 6. However, as will be seen herein, player 200 and cartridge 202 contain additional features, such as a reliable long-life electrical connector system.

Figure 20:
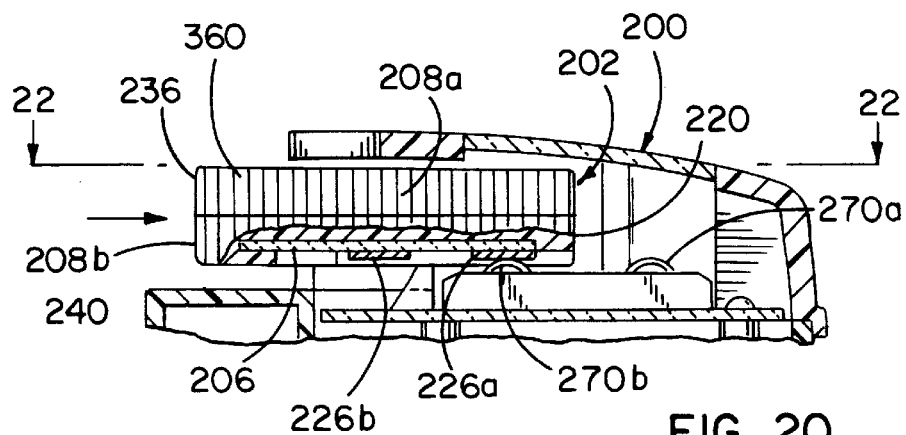
FIG. 20 is a fragmentary cross-sectional view similar to that of FIG. 18 but showing partial insertion of the cartridge of FIG. 15.

As shown for example in FIGS. 17 and 20, cartridge 202 includes a printed circuit board 206 contained within a cartridge housing 208. Cartridge housing 208 is preferably made of plastic material and is preferably formed with a top portion 208a and a bottom portion 208b. As shown in FIG. 15, cartridge housing top portion 208a is preferably made of clear plastic so as to define a window portion 212 for an artwork sheet 214.

With reference to FIG. 17, the cartridge housing bottom portion 208b is also formed of clear plastic material, although other color values for the plastic material and other types of materials could be used, if desired. The major surface (or bottom wall) of cartridge bottom portion 208b includes a cut-out portion 218 which exposes a part of cartridge printed circuit board 206 disposed adjacent the leading edge 220 of cartridge 202.

A first electrical connector 224 is located in the exposed portion of printed circuit board 206. The first electrical connector 224 preferably comprises a two-dimensional array of contacts 226 which preferably take the form of contact pads. The contacts 226 of electrical connector 224 are disposed on the same side of cartridge printed circuit board 206 so as to face in the same direction, away from the interior of cartridge 202. As can be seen in FIG. 17, contact pads 226 are arranged in a regular rectilinear array. Preferably, contacts 226 are arranged in two rows, with the contacts 226a of the first row being located immediately adjacent the leading edge 220 of cartridge 202. The remaining contact pads 226b are arranged in a second row remote from leading edge 220.

The two rows of contact pads are preferably arranged parallel to one another, with the contact pads in each row being spaced similar amounts such that the contact pads of the two rows are arranged in line with one another. If desired, the contact pads of one row could be staggered with respect to the contact pads of the other row, but this is generally not preferred as this would compromise compactness. One advantage of the player and cartridge according to principles of the present invention is the degree of miniaturization which can be obtained using cost effective conventional construction techniques and components. Cartridge 202 is of a very small size, having major surfaces forming a square of approximately seven-eights of an inch on a side and having a thickness or sidewall dimension of approximately one-quarter inch.

The contacts 226 are arranged on printed circuit board 206 in a high density pattern, and are shown in FIG. 17 with a reduced size, for drawing clarity. The contact pads 226, as will be seen herein, slidingly mate with a second electrical connector disposed in player 200. It was required of the commercial product that the mating electrical connectors have a high cycle capability suitable for passing quality control testing procedures of 100,000 operating cycles or more. As those skilled in the art are aware, a consistent, reliable contact force must be established between the electrical contacts of mating electrical connectors. It is generally preferred that the contact force be generated in the second electrical connector disposed in player 200. Accordingly, it is generally preferred that printed circuit board 206 be relatively rigid and inflexible. Together, the printed circuit board 206 and its supporting housing 208 are sufficiently rigid so as to allow the spring force of the second electrical connector and player 200 to be properly developed.

Referring again to FIG. 17, arrow 230 shows the direction of insertion and removal of the cartridge with respect to player 200. Cartridge 202 can take on a variety of shapes and sizes, although it is generally preferred that the cartridge have a relatively constant cross-sectional shape and size with respect to cross-sections taken along line 230. As mentioned, the major surfaces of cartridge 202 have a generally square shape and accordingly, a keying recess 234, which extends from recess 218, adjacent the trailing end 236 of cartridge 202, as provided.

Referring to FIGS. 14 and 18, player 200 includes a body generally indicated at 240 defining an opening 240 communicating with a hollow internal cavity 244. With reference to FIGS. 16 and 18, body 240 includes an upper housing part 250 defining cavity 244, a lower housing part 252 defining a hollow internal cavity 254 and a player printed circuit board 256 separating the player cavities 244, 254. As can be seen, for example in FIGS. 16 and 18, a second electrical connector 260 is carried on the upper surface of printed circuit board 256, that surface facing toward internal cavity 244.

Electrical connector 260 includes a dielectric body 262 and a two-dimensional co-planar array of electrical contacts 270 arranged in two in-line (non-staggered) rows, with contacts 270a disposed adjacent housing opening 240 and the second row of contacts 270b disposed adjacent the enclosed end of housing cavity 244. As can be seen in FIGS. 16 and 18, an upstanding keying post 274 received in recess 218 of cartridge 202 during initial insertion, and finally residing in recess 234 of cartridge 202 when the cartridge is fully seated in player 200.

Although a variety of electrical connector designs can be employed in player 200, the preferred electrical connector 260 is illustrated in FIG. 19. As can be seen in FIG. 19, the electrical contacts 270a and 270b are physically identical to one another, with the electrical contacts of one row opposing the electrical contacts of the other row in mirror image fashion. Electrical contacts 270 have fixed ends 280 and free ends 282. Preferably, electrical contacts 270 are made of spring metal and are compressed a slight amount when loaded into connector body 262 to maintain the electrical contacts in fixed position.

As can be seen in FIG. 19, the free ends 282 are free to travel within the hollow interior of connector body 262. The free ends 282 are disposed immediately adjacent upwardly protruding lobe portions 286 which protrude beyond the upper surface of connector body 262. As cartridge 202 is inserted in player 200 (in a direction parallel to the plane of contacts 270), electrical contact pads 226 are brought into physical and electrical contact with lobe portions 286, causing the free ends 282 to become recessed within connector body 262, storing spring force in the electrical contacts 270.

Figure 21:
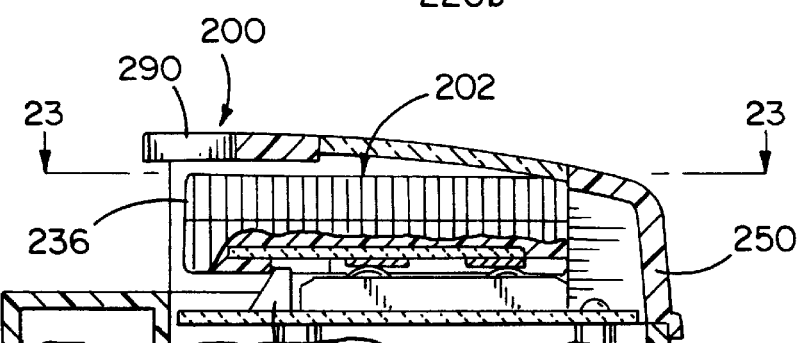
FIG. 21 is a cross-sectional view similar to that of FIG. 20 but showing a cartridge fully inserted within the player.
Figure 24:
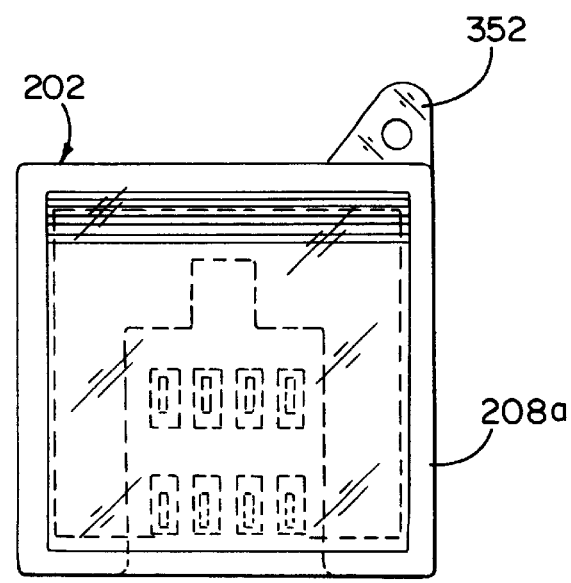
FIG. 24 is a top plan view of the cartridge of FIG. 15.

The stored spring force is withstood by the contact pads 226, the rigid printed circuit board 205 and the cartridge housing 208. As can be seen in FIG. 21, cartridge 202 is in turn supported by upper housing part 250 of player 200. With reference to FIG. 21, the trailing end 236 of cartridge 202 is in contact with, or at least very closely spaced to the free edge portion 290 of upper housing part 250.

With reference to FIG. 14, player 200 includes an electrical cable 302 connected to player printed circuit board 256 in a manner not shown. A conventional strain relief 304 is secured to the rear portion of player housing 252. An acoustic transducer (preferably in the form of an ear bud such as that shown in FIG. 7) is connected by cable 302 to circuitry contained on printed circuit board 256. Other types of acoustic transducers, such as loudspeakers or earphones, may be substituted, if desired.

As mentioned with reference to FIG. 18, lower housing portion 252 cooperates with printed circuit board 256 to define an enclosed hollow cavity 254. With reference to FIG. 15, a spring-loaded clip 308 is attached to the bottom of lower housing portion 252 to provide attachment of the player to a convenient mounting surface, such as a user's belt or other article of clothing, for example. Preferably, the spring clip 308 is secured to a removable cover (not shown) through which access is gained to hollow interior cavity 254. An energy source, such as a set of electrical storage batteries, are disposed within hollow cavity 254 to power circuitry in cartridge 202.

Figure 25:
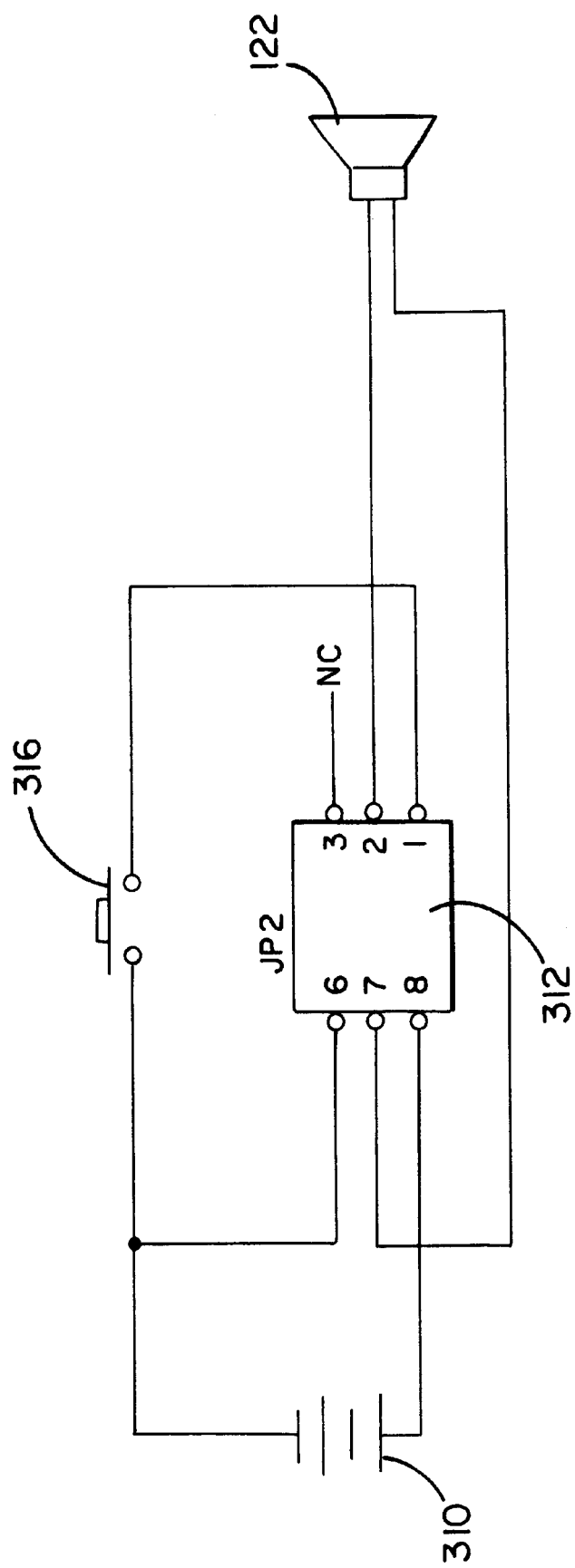
FIG. 25 is a schematic drawing of the circuitry of the player and cartridge shown in FIG. 15.

With reference to FIG. 25, the set of electrical storage batteries is schematically indicated at 310 and, as shown, is coupled to pins 1, 6 and 8 of an integrated circuit package 312. The integrated circuit package 312 also contains memory storing sound data representative of sound, a processing system for processing the sound data and programming executable by the processing system to produce electrical sound signals (at pins 2 and 7) from the sound data. As shown in FIG. 25, ear bud 122 (or other suitable acoustic transducer) is connected to pins 2 and 7 of integrated circuit package 312.

Also shown in FIG. 25 is a control, preferably in the form of a push button switch 316 which selectively couples pin 1 of integrated circuit package 312 to the negative side of battery 310. When push button 316 is closed, circuitry within integrated circuit package 312 and coupled to pin 1, toggles to alternately trigger processing of sound data (so as to produce electrical sound signals at pins 2 and 7) and to discontinue the production of electrical sound signals, turning off operation of the cartridge. Push button switch 316 is preferably located on the body of player 200 as shown, for example, in FIGS. 14 and 15.

As mentioned, battery set 310 and acoustic transducer 122 are carried by player 200. The remainder of the circuitry shown in FIG. 25, that is, the memory, stored sound data, processing system and programming are associated with the cartridge printed circuit board 256.

In the preferred embodiment, the second electrical connector 260 preferably comprises a six-pin sim card connector conventionally employed for vertical loading with a flexible credit card-sized sim card which is loaded on a hinged or other movable member and simultaneously brought into contact with all six electrical contacts 270 of electrical connector 260. Thus, the electrical contacts 270 are designed and conventionally used to accept a pushing force directed normal to the plane of the contacts. In contrast, electrical connector 260 is employed according to the present invention to accept a horizontal loading or sliding force from contact pads carried on a rigid printed circuit board. Thus, the direction of cartridge insertion according to the present invention is parallel (rather than normal) to the plane of the contacts 270.

As shown in FIG. 20, electrical contact is briefly made during cartridge insertion between the row of contacts 226a (located adjacent the leading end 220 of cartridge 202) and the row of contacts 270b (located adjacent opening 240 of player 200). This intermediate condition differs from the final disposition of mating electrical connectors shown in FIG. 21, when cartridge 202 is fully inserted within player 200. The temporary partial insertion condition shown in elevational cross-section in FIG. 20 is also depicted in plan view in FIG. 22. The fully inserted condition as shown in FIG. 21 in elevation is also shown in plan in the corresponding view of FIG. 23. It is generally preferred that the arrangement of pins of integrated circuit package 312 shown in FIG. 25 correspond to the physical arrangement of electrical contact pads 226 of cartridge 202. With reference to FIG. 25, it is preferred that pins 1, 2 and 3 be connected to electrical contact pads 270b such that the incidental contact with electrical contacts 270b of player 200 has a benign effect on the circuitry within integrated circuit package 312.

During intermediate insertion shown in FIG. 20, pin 1 of integrated circuit package 312 makes momentary contact with the contact 270b coupled to one side of the normally open push button switch 316. This, accordingly, does not result in a closed circuit. Also, at the instant in time represented in FIG. 20, pin 2 of integrated circuit package 312 is coupled to one side of transducer 122 and pin 3 of integrated circuit package 312 (which is not connected) makes contact with the negative side of battery set 310. Accordingly, it can be seen that the brief momentary contact indicted in FIG. 20 does not result in injury or unintended operation of the components involved.

It will be noted in comparing FIGS. 16 and 17 that eight electrical contact pads are provided in the cartridge 202 (shown in FIG. 17), whereas only six electrical contacts are shown associated with player 200. The end contacts shown to the right end of both rows of cartridge 202 in FIG. 17 are not used in the embodiment illustrated. It will be noted that the contact pads of cartridge 202 are centered with respect to the cartridge housing, but that the electrical contacts 270 of player 200 are offset to the right hand side of FIG. 16. Thus, electrical connection is not established with the contact pads 226 shown at the right hand side of FIG. 17, and this condition is shown in FIG. 23 where the cartridge contact pads at the left side of FIG. 23 are not mated with corresponding electrical contacts of player 200.

Figure 22:
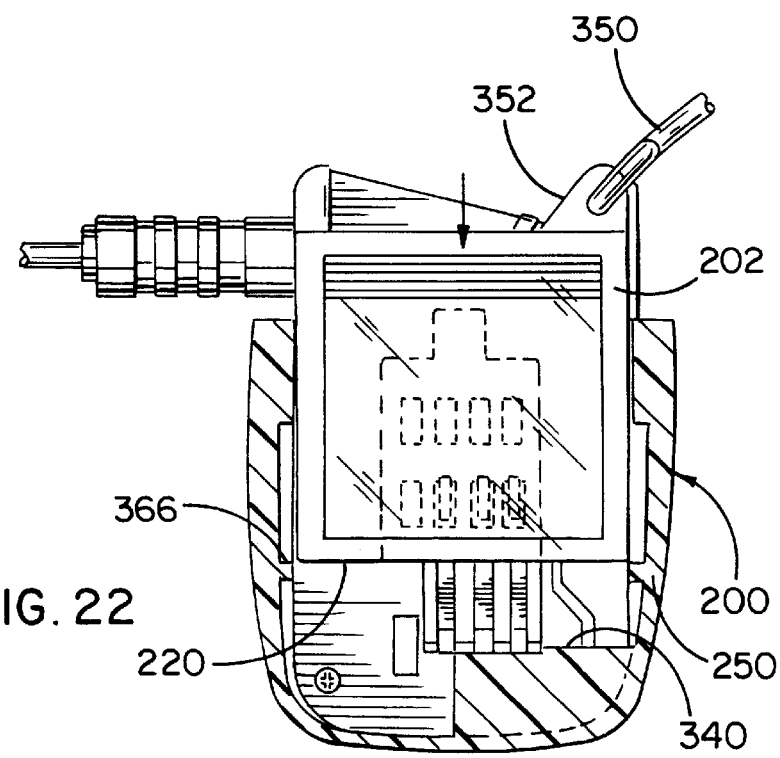
FIG. 22 is a cross-sectional view taken along the line 22—22 of FIG. 20.
Figure 23:
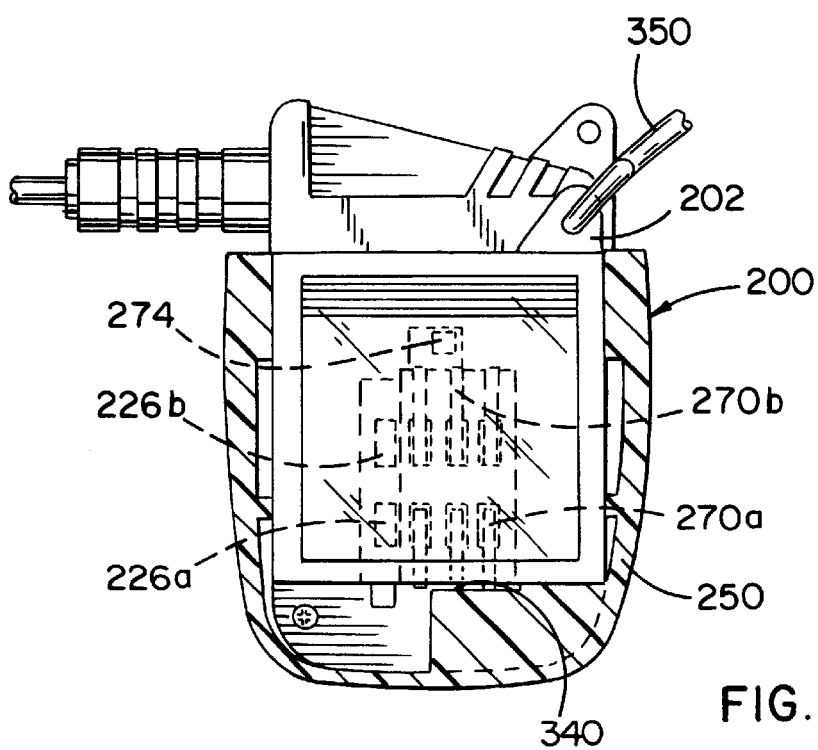
FIG. 23 is a fragmentary view taken along the line 23—23 of FIG. 21.

With reference to FIGS. 22 and 23, it will be seen that, during insertion of cartridge 202 the sides of the cartridge housing are guided by internal cavity-defining surfaces of upper housing portion 250 of player 200. As can be seen in FIG. 23, stop wall 340 of the upper housing part 250 engages the leading end 220 of cartridge 202 to limit insertion of the cartridge, and to cooperate with the internal sidewalls of upper housing portion 250 to locate the contacts of the cartridge and the player in registry with one another. If desired, the upstanding post 274 carried on player 200 can be relied upon to interfere with the bottom wall of cartridge 202 to limit insertion.

As shown, for example in FIGS. 14 and 15, a lanyard or other tension device 250 is attached to a corner projection 352, for withdrawal of cartridge 202 from player 200. Due to the close fit engagement of the guide surfaces of housing portion 250 and the sides of cartridge 202, smooth extraction of the cartridge from the player is made possible without jamming. As indicated, for example in FIG. 15, the sides 360 of cartridge 202 are ribbed with vertical ribs. With reference to FIG. 22, inward protrusions 366 are employed to engage the cartridge ribs with a detent-like action securing the cartridge in place, despite, for example, physical movements of a user wearing the player.

Referring to FIG. 26, an alternative embodiment of an amusement system according to principles of the present invention is shown for recording and playback. A cartridge 500 contains the features of cartridge 202 described above and, in addition; includes recording circuitry to record audio information inputted on conductors within cable 504 of player 506. As shown at the bottom of FIG. 27, the printed circuit board 206 with electrical contact pads 226b are employed in cartridge 500. Located in player 506 is a connector 510 generally similar to electrical connector 260 but including a pair of additional recording signal contacts for transmitting incoming audio signals to, an integrated circuit package (not shown) carried by cart ridge 500. Due to the general shape of the housing of cartridge 500, keying features are not required as with the square-shaped cartridge 202. As with the player 200 and cartridge 202 described above, the player and cartridge of FIGS. 26 and 27 relies on a sliding mating connection between the cartridge and player.

TECHNICAL FIELD

The invention is applicable in the sound and/or image producing industries and other related industries. It is also applicable in the toy and entertainment industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and sub-combinations of the various elements, features, functions, and/or properties disclosed herein. No single feature, function, element, or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and sub-combinations that are directed to one of the disclosed inventions and are novel and non-obvious. Inventions embodied in other combinations and sub-combinations of features, functions, elements, and/or properties may be claimed through amendment of the present claims or presentation of new claims in this or a related application. Such amended or new claims, whether they are directed to a different invention or directed to the same invention whether different, broader, narrower, or equal in scope to the original claims, are also regarded as included within the subject matter of the inventions of the present disclosure.

What is claimed is:

1. An amusement system comprising:

first and second mating electrical connectors;

a cartridge configured to store sound data representative of sound and to produce electrical sound signals representative of sound, the cartridge including a housing, memory storing said sound data, a processing system for processing said sound data, programming executable by the processing system to produce said electrical sound signals from said sound data, and said first electrical connector;

a player to receive electrical sound signals from the cartridge and to produce sound vibrations from the received sound signals, said player including said second electrical connector, a body defining a cavity with an opening communicating with the cavity and configured to releasably receive the cartridge so as to bring said first and said second electrical connectors in mating electrical contact with one another, the second electrical connector including a two-dimensional co-planar array of electrical contacts arranged in two in-line non-staggered rows and the player further including a transducer to produce the sound vibrations, and controls configured to trigger said cartridge so as to produce said electrical sound signals and to transmit those electrical sound signals to the transducer to produce sound vibrations, and said cartridge alone including a processing system, to the exclusion of a processing system in the player, to process the electrical sound signals received from the said cartridge smaller than said player so as to be adapted for sliding insertion into said player opening so as to enter said player cavity, with said player body guiding said cartridge housing for telescopic insertion and extraction with respect to said player.

2. The amusement system of claim 1 wherein said first and said second electrical connectors are adapted for sliding connection.

3. The amusement system of claim 2 wherein said cartridge has a generally constant cross-sectional shape and wherein said player housing includes a player printed circuit board arranged for close tolerance telescopic sliding fit with said cartridge so as to guide said cartridge during insertion within said player and so as to guide the electrical contacts of said first electrical connector with the electrical contacts of said second electrical connector.

4. The amusement system of claim 1 wherein said player body includes a player printed circuit board supporting said second electrical connector and a housing at least partly defining said cavity and said opening.

5. The amusement system of claim 4 wherein said player printed circuit board is substantially rigid.

6. The amusement system of claim 5 wherein said player housing and player printed circuit board cooperate to define said cavity.

7. The amusement system of claim 1 wherein said second electrical connector comprises a plurality of electrical contacts.

8. The amusement system of claim 7 wherein said electrical contacts of said second electrical connector are arranged in a generally coplanar array.

9. The amusement system of claim 7 wherein said electrical contacts of said second electrical connector are arranged on the same side of said player printed circuit board.

10. The amusement system of claim 9 wherein the electrical contacts carried by said player printed circuit board face toward said player cavity.

11. The amusement system of claim 11 wherein said electrical contacts of said second electrical connector are biased to establish mating contact with electrical contacts of said first electrical connector.

12. The amusement system of claim 11 wherein said player body supports said cartridge against the bias force applied by the electrical contacts of said second electrical connector.

13. The amusement system of claim 7 wherein said contacts of said second electrical connector are carried on a common connector body carried on said player printed circuit board.

14. The amusement system of claim 13 wherein said contacts of said second electrical connector have first ends secured to said connector body and second free ends which are movable when contacted by said first electrical connector.

15. The amusement system of claim 9 wherein said electrical contacts of said second electrical connector are arranged in two spaced apart rows.

16. The amusement system of claim 15 wherein the electrical contacts of said rows are aligned in-line and are not staggered.

17. The amusement system of claim 1 wherein said first electrical connector comprises a plurality of electrical contacts.

18. The amusement system of claim 17 wherein said electrical contacts of said first electrical connector comprises a plurality of contact pads.

19. The amusement system of claim 17 wherein said cartridge includes a cartridge printed circuit board carrying said contacts.

20. The amusement system of claim 19 wherein said cartridge printed circuit board is relatively rigid.

21. The amusement system of claim 19 wherein said cartridge printed circuit board carries said memory, said processing system and said programming.

22. The amusement system of claim 19 wherein said memory, said processing system and said programming of the cartridge are contained on a single chip carried on said cartridge printed circuit board.

23. The amusement system of claim 19 wherein said electrical contacts of said first electrical connector are arranged in a generally coplanar array.

24. The amusement system of claim 19 wherein said electrical contacts of said first electrical connector are arranged on the same side of said housing printed circuit board.

25. The amusement system of claim 23 wherein said electrical contacts of said first electrical connector are arranged in two spaced apart rows.

26. The amusement system of claim 25 wherein the electrical contacts of said rows are aligned in-line and are not staggered.

27. The amusement system of claim 1 wherein said player controls comprise a switch.

28. The amusement system of claim 28 wherein said switch comprises a push button switch.

29. The amusement system of claim 1 wherein said switch is operable, when said first and said second electrical connectors are matingly engaged, to trigger the cartridge to stop producing said electrical sound signals.

30. The amusement system of claim 1 wherein said player further includes a power supply configured to supply power to the cartridge when said first and said second electrical connectors are matingly engaged.

31. A cartridge for use in an amusement system having a player with having a body defining a cavity and an opening communicating with the cavity to receive the cartridge, a second electrical connector communicating with the cavity, and controls configured to trigger the cartridge, said cartridge comprising:

a housing, including a first electrical connector comprising a plurality of electrical contacts arranged in two in-line non-staggered rows in a two-dimensional co-planar array;

a cartridge printed circuit board within the housing, carrying said electrical contacts;

memory, carried by said cartridge printed circuit board, storing data;

a processing system carried by said cartridge printed circuit board for processing said data; and programming on said printed circuit board executable by the processing system to produce electrical signals from said data.

32. The cartridge of claim 31 wherein said electrical contacts of said first electrical connector comprises a plurality of contact pads.

33. The cartridge of claim 31 wherein said cartridge printed circuit board is relatively rigid.

34. The cartridge of claim 31 wherein said memory, said processing system and said programming of the cartridge are contained on a single chip carried on said cartridge printed circuit board.

35. The cartridge of claim 31 wherein said electrical contacts of said first electrical connector are arranged in a generally coplanar array.

36. The cartridge of claim 35 wherein said electrical contacts of said first electrical connector are arranged on the same side of said cartridge printed circuit board.

37. The cartridge of claim 35 wherein said electrical contacts of said first electrical connector are arranged in two spaced apart rows.

38. The cartridge of claim 37 wherein the electrical contacts of said rows are aligned in-line and are not staggered.

39. A player for use in an amusement system having a cartridge with a housing, a cartridge printed circuit board carrying memory storing data, a processing system for processing the data, programming executable by the processing system to produce electrical signals from the data and a first electrical connector, said player comprising:

a second electrical connector including a two-dimensional co-planar array of electrical contacts arranged in two in-line non-staggered rows;

a body carrying said second electrical connector;

said body defining a cavity with an opening communicating with the cavity and configured to releasably receive the cartridge so as to bring said first and said second electrical connectors in mating electrical contact with one another;

circuitry to receive said electrical signals; and controls configured to trigger said cartridge so as to produce said electrical signals and to transmit those electrical signals through said first and said second electrical connectors.

40. The player of claim 39 wherein said player is devoid of a processing system for processing said data.

41. The player of claim 39 wherein said second electrical connector is adapted for sliding connection with said first electrical connector.

42. The player of claim 39 wherein said player body includes a player printed circuit board supporting said second electrical connector and a housing at least partly defining said cavity and said opening.

43. The player of claim 42 wherein said player printed circuit board is substantially rigid.

44. The player of claim 43 wherein said player housing and player printed circuit board cooperate to define said cavity.

45. The player of claim 39 wherein said second electrical connector comprises a plurality of electrical contacts.

46. The player of claim 45 wherein said electrical contacts of said second electrical connector are arranged in a generally coplanar array.

47. The player of claim 45 wherein said electrical contacts of said second electrical connector are arranged on the same side of said player printed circuit board.

48. The player of claim 47 wherein the electrical contacts carried by said player printed circuit board face toward said player cavity.

49. The player of claim 48 wherein said electrical contacts of said second electrical connector are biased to establish mating contact with electrical contacts of said first electrical connector.

50. The player of claim 45 wherein said contacts of said second electrical connector are carried on a common connector body which is carried on said player printed circuit board.

51. The player of claim 50 wherein said contacts of said second electrical connector have first ends secured to said connector body and second free ends which are movable when contacted by said first electrical connector.

52. The player of claim 47 wherein said electrical contacts of said second electrical connector are arranged in two spaced apart rows.

53. The player of claim 52 wherein the electrical contacts of said rows are aligned in-line and are not staggered.

54. The player of claim 39 wherein said player controls comprise a switch.

55. The player of claim 54 wherein said switch comprises a push button switch.

56. The player of claim 39 wherein said switch is operable, when said first and said second electrical connectors are matingly engaged, to trigger the cartridge to stop producing said electrical sound signals.

57. The player of claim 39 wherein said player further includes a power supply configured to supply power to the cartridge when said first and said second electrical connectors are matingly engaged.

* * * * *